United States Patent
Song et al.

(10) Patent No.: US 10,879,887 B2
(45) Date of Patent: Dec. 29, 2020

(54) SMART TURN-OFF FOR GATE DRIVER CIRCUIT

(71) Applicant: SEMICONDUCTOR COMPONENTS INDUSTRIES, LLC, Phoenix, AZ (US)

(72) Inventors: Kinam Song, Seoul (KR); JunHo Lee, Bucheon (KR); Wonhi Oh, Bucheon (KR); Jinkyu Choi, Bucheon (KR)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 505 days.

(21) Appl. No.: 15/935,291

(22) Filed: Mar. 26, 2018

(65) Prior Publication Data

US 2019/0296728 A1 Sep. 26, 2019

(51) Int. Cl.
| | |
|---|---|
| *H03K 17/08* | (2006.01) |
| *H03K 5/01* | (2006.01) |
| *H03K 19/003* | (2006.01) |
| *H03K 5/00* | (2006.01) |

(52) U.S. Cl.
CPC .............. *H03K 17/08* (2013.01); *H03K 5/01* (2013.01); *H03K 19/003* (2013.01); *H03K 2005/00078* (2013.01); *H03K 2217/0063* (2013.01); *H03K 2217/0072* (2013.01)

(58) Field of Classification Search
CPC ........ H03K 17/08; H03K 5/01; H03K 19/003; H03K 2217/0072; H03K 2005/00078; H03K 2217/0063; H03K 17/08128; H03K 17/168; H03K 17/163; H03K 17/08122; H03K 17/08126; H03K 17/284; H02H 7/0854
USPC ....................................................... 361/93.1
See application file for complete search history.

(56) References Cited

U.S. PATENT DOCUMENTS

| | | | | |
|---|---|---|---|---|
| 5,019,724 | A * | 5/1991 | McClure ............. | H03K 5/1252 326/29 |
| 2004/0136135 | A1 | 7/2004 | Takahashi | |
| 2007/0223154 | A1 | 9/2007 | Locatelli et al. | |
| 2008/0180150 | A1 * | 7/2008 | Yamamoto ............. | H03K 5/135 327/161 |
| 2015/0263850 | A1 * | 9/2015 | Asada ....................... | G06F 1/04 375/371 |
| 2017/0230038 | A1 * | 8/2017 | Shin ........................ | H03K 5/14 |

* cited by examiner

*Primary Examiner* — Dharti H Patel
(74) *Attorney, Agent, or Firm* — AMPACC Law Group, PLLC

(57) ABSTRACT

A circuit for controlling a gate driver includes a delay circuit, a first logic circuit, and a second logic circuit. The delay circuit receives a first turn-off signal and produces a second turn-off signal by delaying an assertion of the first turn-off signal by a freewheeling duration. The first logic circuit receives the first and second turn-off signals and produces a smart turn-off signal by asserting the smart turn-off signal when the first turn-off signal is asserted and the second turn-off signal is not asserted. The second logic circuit receives a restart signal and the smart turn-off signal and produces a smart reset signal by asserting the smart reset signal when the restart signal and the smart turn-off signal are de-asserted, and de-asserting the smart reset signal when one or more of the restart signal and the smart turn-off signal are asserted.

20 Claims, 9 Drawing Sheets

FIG. 12

SMART TURN-OFF FOR GATE DRIVER CIRCUIT

FIELD OF THE DISCLOSURE

The present disclosure relates to control of semiconductor power switching devices, and in particular to shutdown circuits for protecting semiconductor power switching devices in response to abnormal conditions such as short circuits.

BACKGROUND

Overcurrent protection may be used to protect semiconductor power switching devices (hereinafter, switches) from catastrophic destruction. The overcurrent protection may sense an overcurrent condition and may shut down one or more gate driver circuits (hereinafter, gate drivers) controlling the switches, and then may restart the gate driver when the overcurrent condition has ended. The overcurrent condition sensed may be, for example, a short-circuit between two phases of a motor controlled by the switches.

A shutdown of a gate driver may be a hard turn-off or a soft turn-off. In a hard turn-off, the gate driver turns off a switch rapidly, without controlling a rate of decrease of current through the switch. In a soft turn-off, the gate driver turns off the switch gradually, decreasing the current through the switch less rapidly than a hard turn-off.

A soft turn-off may be preferred to a hard turn-off because the soft turn-off limits the rate of change of a current ($\delta i/\delta t$) flowing through the switch and therefore produces a lower inductance-induced surge voltage across the switch than a hard turn-off would. Because surge voltages can cause components to fail, reducing the surge voltage enhances the reliability of an apparatus that includes the switches.

BRIEF DESCRIPTION OF THE DRAWINGS

In the accompanying figures like reference numerals refer to identical or functionally similar elements throughout the separate views, together with the detailed description below, and are incorporated in and form part of the specification to further illustrate embodiments of concepts that include the claimed invention and explain various principles and advantages of those embodiments.

DETAILED DESCRIPTION

Embodiments relate to circuits and methods for controlling the turn-off of switches.

In the following detailed description, certain illustrative embodiments have been illustrated and described. As those skilled in the art would realize, these embodiments may be modified in various different ways without departing from the scope of the present disclosure. Accordingly, the drawings and description are to be regarded as illustrative in nature and not restrictive. Like reference numerals designate like elements in the specification.

In an embodiment, an electronic circuit comprises a delay circuit having an input coupled to a first turn-off signal and an output producing a second turn-off signal. The delay circuit produces the second turn-off signal by delaying an assertion of the first turn-off signal by a freewheeling duration. A first logic circuit has first and second inputs respectively coupled to the first and second turn-off signals and has an output producing an advanced smart turn-off signal. The first logic circuit asserts the advanced smart turn-off signal when the first turn-off signal is asserted and the second turn-off signal is not asserted. A second logic circuit has a first input coupled to a restart signal, a second input coupled to the advanced smart turn-off signal, and an output producing an advanced smart reset signal. The second logic circuit asserts the advanced smart reset signal when both the restart signal and the advanced smart turn-off signal are de-asserted, and de-asserts the advanced smart reset signal when the restart signal, the advanced smart turn-off signal, or both are asserted.

In an embodiment, a high side turn-off signal is generated by delaying a low side turn-off signal by an interval corresponding to a predetermined freewheeling duration. In an embodiment, a high side control signal is prevented from affecting the operation of a high side switch while the high side turn-off signal is asserted. In an embodiment, an additional reset pulse is generated for a gate driver when conditions occur that might cause a malfunction of the gate driver, such as when the high side control signal turns off a high side switch in an interval between the occurrence of an overcurrent condition and the assertion of the low side turn-off signal.

Embodiments perform a smart turn-off by performing a soft turn☐off of a low side switch while preventing, until after the completion of the soft turn☐off, a hard turn☐off of a high side switch, in order to provide protection from overcurrent conditions such as a short☐circuit. In conjunction with the soft turn-off of the low side switch, embodiments ensure that a predetermined freewheeling duration occurs before a hard turn-off of the high side switch, even if a high side control input goes low during the freewheeling duration. Embodiments also generate an additional reset pulse to turn off the high side switch in order to protect against a malfunction that may be caused by the high side control input causing a hard turn-off of the high side switch after the overcurrent condition has occurred but before the embodiment has begun the smart turn-off.

Figure 1:
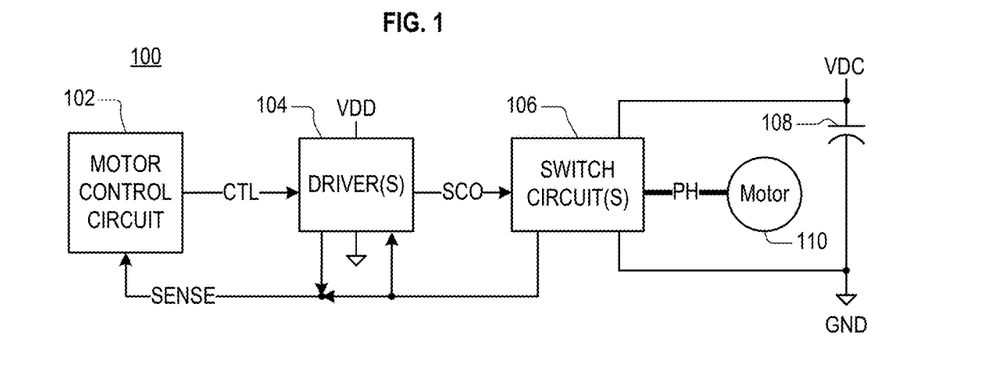
FIG. 1 illustrates an apparatus for controlling an electric motor according to an embodiment.

FIG. 1 illustrates an apparatus 100 according to an embodiment. The apparatus 100 controls an electric motor (hereinafter motor) 110 by supplying current to coils of the electric motor through one or more phase signals PH.

In embodiments, the motor 110 may be a Brush-Less Direct Current (BLDC) motor, an Alternating Current Induction Motor (ACIM), or a Permanent Magnet Synchronous Motor (PSMS), but embodiments are not limited thereto. In embodiments, the electric motor may have one winding, two windings, three windings, or more.

The apparatus 100 includes a motor control circuit 102, one or more gate driver circuits (hereinafter "gate drivers") 104, one or more switch circuits 106, and a decoupling capacitor 108. In embodiments, the switch circuits 106 each include one or more switches each comprising an Insulated Gate Bipolar Transistors (IGBTs) or a Metal Oxide Semiconductor Field Effect Transistors (MOSFETs). In embodiments, the gate drivers 104 and the switch circuits 106 are provided in separate packages. In other embodiments, the gate drivers 104 and the switch circuits 106 are provide in a same package.

The motor control circuit 102 provides one or more driver control signals CTL to each of the gate drivers 104, which each provide one or more switch control signals SCO to one or more respective switch circuits 106. The motor control circuit 102 receives one or more sense signals SENSE from the gate drivers 104, the switch circuits 106, or both. The sense signals SENSE may include one or more of current sense signal(s), temperature sense signal(s), fault detection signal(s), and the like.

The gate drivers 104 receive the driver control signals CTL from the motor control circuit 102 and, in embodiments, may receive one or more sense signals SENSE from the switch circuits 106. The gate drivers 104 generate the switch control signals SCO according to the received signals. The gate drivers 104 may also generate the switch control signals SCO according to internally-generated indications such as low voltage indications or over-temperature indications.

The switch control signals SCO control the switch circuits 106 to couple the DC voltage VDC to one or more selected terminals of the coils of the motor 110 and to couple the ground to one or more selected other terminals of the coils of the motor 110. Accordingly, the switch circuits 106 are operated to control whether current flows through each coil of the motor 110 and the direction the current flows in. A switch in a switch circuit 106 that may be controlled to couple the DC voltage VDC to a coil of the motor 110 may be referred to as a high side (HS) switch. A switch in a switch circuit 106 that may be controlled to couple the ground GND to a coil of the motor 110 may be referred to as a low side (LS) switch.

In embodiments, the gate drivers 104, in response to a fault condition, control the switch circuits 106 to terminate any currents flowing to or from the motor 110 independent of the values of the driver control signals CTL. Terminating the currents may include performing a soft turn-off of one or more switches of the switch circuits 106, performing a delayed hard turn-off of one or more switches of the switch circuits 106, or both. The fault condition may be an overcurrent condition, such as may be caused, for example, by a short circuit between coil terminals of the motor 110.

In an embodiment, the gate drivers 104 perform a delayed hard turn-off of one or more switches of the switch circuits 106 (for example, a HS switch) while guaranteeing that those switches are not turned off (by, for example, a transition of one of the driver control signals CTL) before the end of a predetermined freewheeling time.

In an embodiment, the gate drivers 104 are configured to prevent a turn-off of one or more switches of the switch circuits 106 (e.g., a HS switch) during an interval wherein one or more other switches of the switch circuits 106 (e.g., a LS switch) are being controlled to perform a soft turn-off.

In an embodiment, the gate drivers 104 are configured to protect against a malfunction caused by a hard turn-off indication of the driver control signals CTL that occurs after an overcurrent condition, such as a short circuit, occurs.

Figure 2:
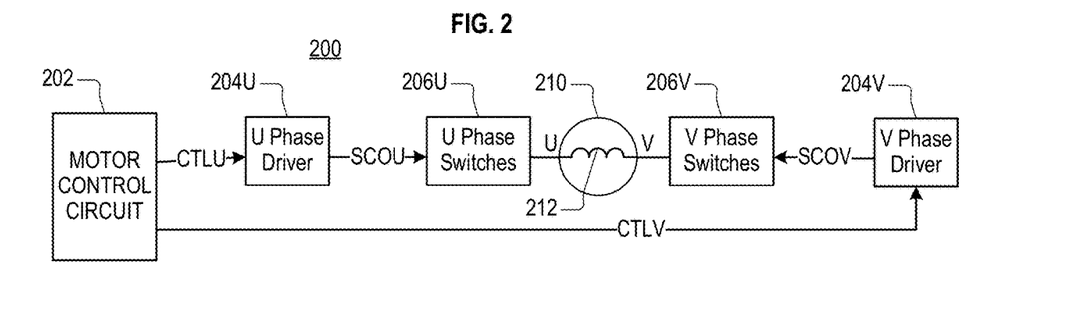
FIG. 2 illustrates a full-bridge motor control apparatus according to an embodiment.

FIG. 2 illustrates a full-bridge motor control apparatus 200, according to an embodiment, that controls an electric motor 210 which includes a single coil 212. The apparatus 200 controls a magnitude and a direction of a current through the coil 212.

The apparatus 200 includes a motor control circuit 202, first and second gate drivers 204U and 204V, and first and second switch circuits 206U and 206V. The gate drivers 204U and 204V may together correspond to the gate drivers 104 of FIG. 1, and the switch circuits 206U and 206V may together correspond to the switch circuits 106 of FIG. 1.

In an embodiment, the gate drivers 204U and 204V are included in a same integrated circuit device. In an embodiment, the gate drivers 204U and 204V and the switch circuits 206U and 206V are included in a same integrated circuit device.

The motor control circuit 202 controls the first and second gate drivers 204U and 204V using first and second driver control signals CTLU and CTLV, respectively. The driver control signals CTLU and CTLV may together correspond to the driver control signals CTL of FIG. 1. The first gate driver 204U controls the first switch circuit 206U using the first switch control signals SCOU. The second gate driver 204V controls the second switch circuit 206V using the second switch control signals SCOV. The switch control signals SCOU and SCOV may together correspond to the switch control signals SCO of FIG. 1.

A current through the coil 212 may flow in a first direction when the first gate driver 204U turns on a HS switch of the first switch circuit 206U and the second gate driver 204V turns on a LS switch of the second switch circuit 206V. In response to the detection of a fault condition when the current is flowing in the first direction, the second gate driver 204V may control the LS switch of the second switch circuit 206V to perform a soft turn-off while the first gate driver 204U maintains the HS switch of the first switch circuit 206U in the on state. After the soft turn-off of the LS switch of the second switch circuit 206V is complete and after a predetermined freewheeling interval has elapsed from the detection of the fault condition, the first gate driver 204U turns off the HS switch of the first switch circuit 206U. In an embodiment, the first gate driver 204U controls the HS switch to perform a hard turn-off. The fault condition may be an overcurrent condition or a short circuit condition, such as a short circuit across the coil 212.

The first gate driver 204U prevents the HS switch from being turned off by the first gate driver control signals CTLU during the freewheeling interval. Furthermore, the first gate driver 204U may operate to ensure that the HS switch is turned off at the end of the freewheeling interval when a malfunction causes the HS switch to be turned on after the fault condition arises.

The current through the coil 212 may flow in a second direction opposite the first direction when the first gate driver 204U turns on a LS switch of the first switch circuit 206U and the second gate driver 204V turns on a HS switch of the second switch circuit 206V. In response to the detection of a fault condition when the current is flowing in the second direction, the first gate driver 204U may control the LS switch of the first switch circuit 206U to perform a soft turn-off while the second gate driver 204V maintains the HS switch of the second switch circuit 206V in the on state. After the soft turn-off of the LS switch of the first switch circuit 206U is complete and after the freewheeling interval has elapsed from the detection of the fault condition, the second gate driver 204V turns off the HS switch of the second switch circuit 206V. In an embodiment, the second gate driver 204V controls the HS switch to perform a hard turn-off.

The second gate driver 204V prevents the HS switch from being turned off by the second driver control signals CTLV during the freewheeling interval. Furthermore, the first gate driver 204V may operate to ensure that the HS switch is turned off at the end of the freewheeling interval when a malfunction causes the HS switch to be turned on after the fault condition arises.

Figure 3:
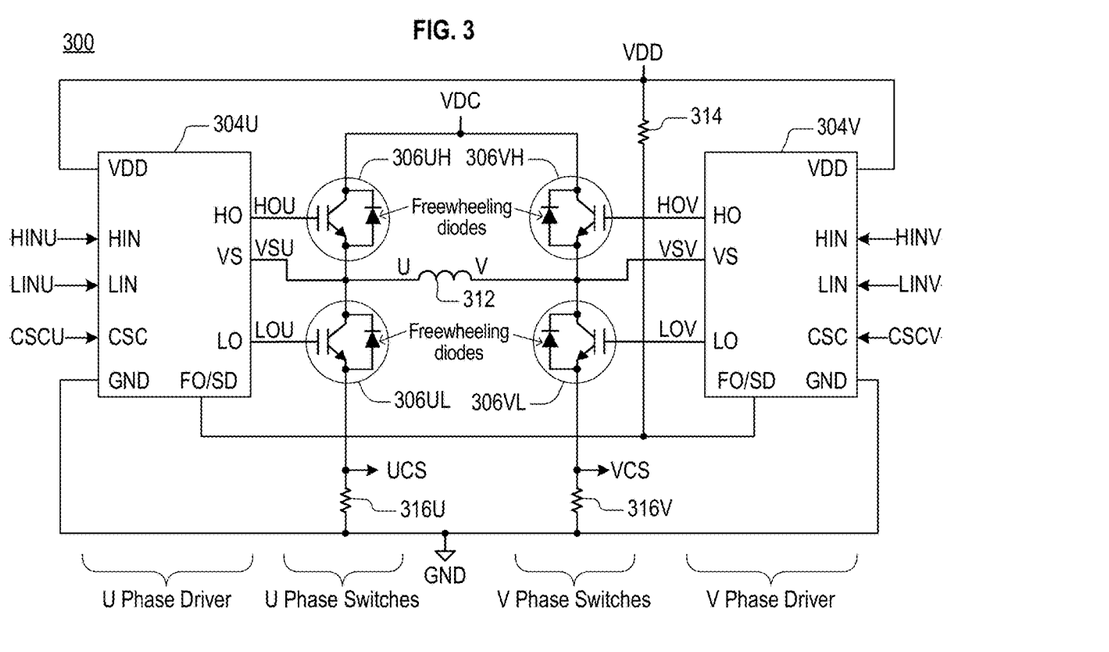
FIG. 3 illustrates a portion of a full-bridge motor control circuit according to an embodiment.

FIG. 3 illustrates a circuit 300 corresponding to a portion of the apparatus 200 of FIG. 2 according to an embodiment. The illustrated portions correspond to the gate drivers 204U and 204V and switch circuits 206U and 206V of FIG. 2. A coil 312 of FIG. 3 corresponds to the coil 212 of the electric motor 210 of FIG. 2.

The circuit 300 of FIG. 3 includes first and second gate drivers 304U and 304V, first and second HS switches 306UH and 306VH, first and second LS switches 306UL and 306VL, a pull-up resistor 314, and first and second current sense (CS) resistors 316U and 316V. The first HS switch 306UH, first LS switch 306UL, and first CS resistor 316U together correspond to the first switch circuit 206U of FIG. 2. The second HS switch 306VH, second LS switch 306VL, and second CS resistor 316V together correspond to the second switch circuit 206V of FIG. 2.

In the embodiment shown in FIG. 3, the HS and LS switches 306UH, 306UL, 306VH, and 306VL each comprise an IGBT and an integrated freewheeling diode connected anti-parallel across the IGBT, but embodiments are not limited thereto. In another embodiment, the switches each comprise a discrete IGBT and a discrete freewheeling diode. In another embodiment, the switches each comprise a MOSFET and an integrated or discrete freewheeling diode.

Each of the switches 306UH, 306UL, 306VH, and 306VL shown in FIG. 3 includes a first conduction terminal corresponding to a collector of the included IGBT, a second conduction terminal corresponding to an emitter of the included IGBT, and a control terminal corresponding to a gate of the included IGBT.

The gate drivers 304U and 304V include respective high side in (HIN), low side in (LIN), and current sense (CS) signals (CSC), which for the first gate driver 304U respectively receive a first high side in signal HINU, first low side in signal LINU, and first CS signal CSCU, and which for the second gate driver 304V respectively receive a second high side in signal HINV, second low side in signal LINV, and second CS signal CSCV. The first high side in signal HINU, first low side in signal LINU, and first CS signal CSCU may collectively correspond to the first driver control signals CTLU of FIG. 2, and the second high side in signal HINV, second low side in signal LINV, and second CS signal CSCV may collectively correspond to the second driver control signals CTLV of FIG. 2. In an embodiment the first and second CS signals CSCU and CSCV may be a same signal.

The gate drivers 304U and 304V further include respective logic supply voltage VDD, DC supply voltage VDC, and ground GND terminals.

The gate drivers 304U and 304V generate respective high side out (HO), bootstrap voltage return (VS), and low side out (LO) signals, through which the first gate driver 304U respectively supplies a first high side out signal HOU, a first bootstrap voltage return VSU, and a first low side out signal LOU, and through which the second gate driver 304V respectively supplies a second high side out signal HOV, a second bootstrap voltage return VSV, and a second low side out signal LOV. The signals HOU, VSU, and LOU may collectively correspond to the first switch control signals SCOU of FIG. 2, and the signals HOV, VSV, and LOV may collectively correspond to the second switch control signals SCOV of FIG. 2.

The first high side out signal HOU and first bootstrap voltage return VSU are respectively supplied to the control terminal and the second conduction terminal of the first HS switch 306UH. The first low side out signal LOU is supplied to the control terminal of the first LS switch 306UL.

The second high side out signal HOV and second bootstrap voltage return VSV are respectively supplied to the control terminal and the second conduction terminal of the second HS switch 306VH. The second low side out signal LOV is supplied to the control terminal of the second LS switch 306VL.

The first conduction terminals of the HS switches 306UH and 306VH are coupled to the DC voltage VDC. The second conduction terminal of the first HS switch 306UH and the first conduction terminal of the first LS switch 306UL are coupled to a first terminal U of the coil 312. The second conduction terminal of the second HS switch 306VH and the first conduction terminal of the second LS switch 306VL are coupled to a second terminal V of the coil 312. The second conduction terminals of the first and second LS switches 306UL and 306VL are respectively coupled to ground GND through the first and second CS resistors 316U and 316V.

First and second CS signals UCS and VCS are respectively generated across the first and second CS resistors 316U and 316V. The CS signals UCS and VCS may be supplied to a motor control circuit (such as the motor control circuit 202 of FIG. 2) and may be used to generate one or more of the CS signals CSCU and CSCV.

The gate drivers 304U and 304V also include respective Fault-Out/Shut-Down (FO/SD) input-output signals that are configured to be connected in a wired-OR configuration with the pull-up resistor 314, so that the FO/SD signal has a low value when pulled low by one or more of the gate drivers 304U and 304V, and a high value otherwise.

Operation of the circuits shown in FIG. 3 will be described with respect to FIGS. 4 through 9, below.

FIGS. 4A through 4D illustrate operation of a smart turn-off circuit of a gate driver in response to a short circuit between two terminals of a motor controlled by the gate driver. In FIGS. 4A through 4D, a short circuit occurs between two terminal of a single coil motor, but embodiments are not limited thereto. For example, embodiments may operate in response to a short circuit between any two coils of a motor having three or more coils.

Figure 4A:
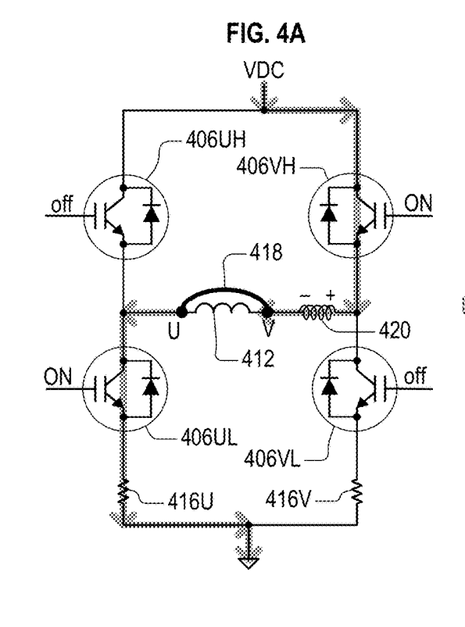
FIG. 4A illustrates operation immediately after a short circuit has occurred of a portion of a full-bridge motor control circuit according to an embodiment.

FIGS. 4A though 4D each include a first and second HS switches 406UH and 406VH, first and second LS switches 406UL and 406VL, first and second CS resistors 416U and 416V, and a coil 412, which respectively correspond to the similarly named and numbered components of FIG. 3. FIGS. 4A though 4D further include a short circuit 418 across the coil 412, and a parasitic inductance 420 representing the combined parasitic inductances of the connection from the switches to the first terminal U of the coil 412 and the connection from the switches to the second terminal V of the coil 412.

FIG. 4A illustrates operation immediately after a short circuit has occurred. Current (indicated by gray arrows) flows from the DC voltage VDC to the ground GND through the second HS switch 406VH, the short circuit 418, and the first LS switch 406UL.

As the current flows, it causes energy to be stored in the parasitic inductance 420 as a magnetic field. A voltage drop develops across the parasitic inductance 420 over time.

Figure 4B:
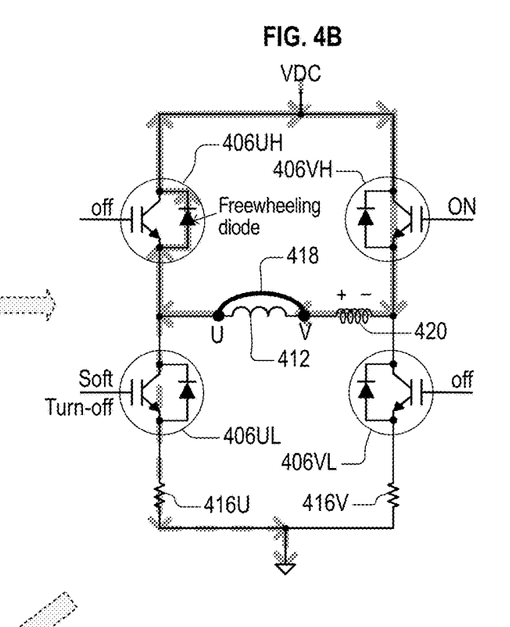
FIG. 4B illustrates operation while soft turn-off is applied to a low-side switch of a full-bridge motor control circuit according to an embodiment.

FIG. 4B illustrates operation while soft turn-off of the first LS switch 406UL is performed. As the first LS switch 406UL is turned off, the current from the DC voltage VDC to the ground GND decreases, as indicated by the dashed gray arrows.

The decrease in the current is resisted by the parasitic inductance 420. The voltage drop across the parasitic inductance 420 reverses polarity as the parasitic inductance 420 draws energy from its stored magnetic field to generate current. The current generated by the parasitic inductance 420 flows from the positive terminal of the parasitic inductance 420 to the negative terminal of the parasitic inductance 420, flowing through the short circuit 418, the freewheeling diode of the first HS switch 406UH, and the second HS switch 406VH, as indicated by the solid gray arrows.

Figure 4C:
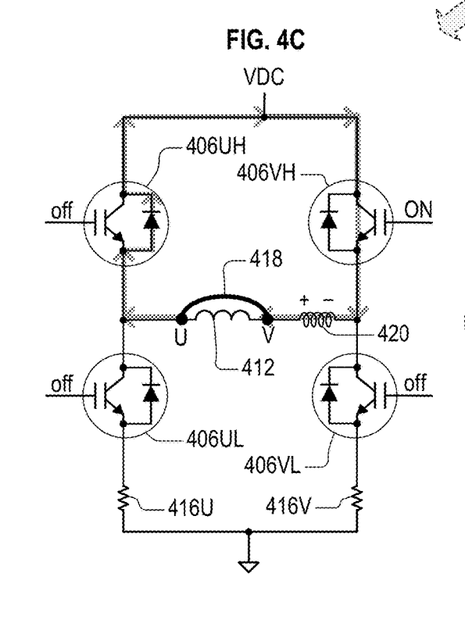
FIG. 4C illustrates operation during a smart turn-off delay period of a full-bridge motor control circuit according to an embodiment.

FIG. 4C illustrates operation during a smart turn-off delay period after the soft turn-off of the first LS switch 406UL is complete. During this period, the second HS switch 406VH remains turned on and no current flows from the DC voltage VDC to the ground GND.

The current generated by the decay of the magnetic field of the parasitic inductance 420 flows from the positive terminal of the parasitic inductance 420 to the negative terminal of the parasitic inductance 420, flowing through the short circuit 418, the freewheeling diode of the first HS switch 406UH, and the second HS switch 406VH. The current decreases as the magnetic field decreases.

Figure 4D:
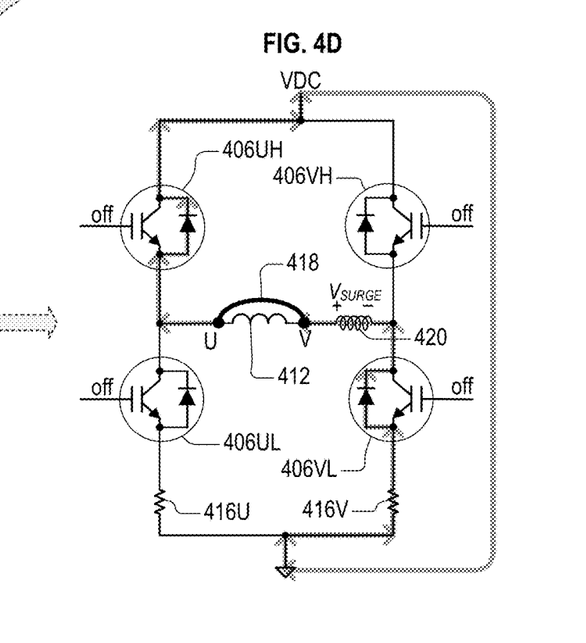
FIG. 4D illustrates operation after the smart turn-off delay period of a full-bridge motor control circuit according to an embodiment.

FIG. 4D illustrates operation after the smart turn-off delay period, when all of the switches 406UH, 406VH, 406UL, and 406VL are turned off. Because the magnetic field of the parasitic inductance 420 has not yet deceased to zero at the time shown in FIG. 4D, a current is still being generated by the parasitic inductance 420.

The current must still flow from the positive terminal of the parasitic inductance 420 to the negative terminal of the parasitic inductance 420. The only path available for the current is through the short circuit 418, the freewheeling diode of the first HS switch 406UH, the power supply that provides the DC voltage VDC and back through the ground GND, and then through the freewheeling diode of the second LS switch 406VH. In an embodiment, the path of the current from the DC voltage VDC to the ground GND includes a decoupling capacitor, such as the decoupling capacitor 108 of FIG. 1

In order for the current to flow through this path, the voltage generated across the parasitic inductance 420 rises to a value greater than the value of the DC voltage VDC, generating a potentially damaging surge voltage $V_{SURGE}$ having a value of:

$$V_{SURGE} = V_{VDC} + 2 \times V_{FD} + I_{P\_IND}(R_{VDC} + R_{CS}) \quad \text{Equation 1}$$

wherein $V_{VDC}$ is the voltage of the DC voltage VDC, $V_{FD}$ is the forward voltage drop of the freewheeling diodes of the switches 406UH, 406VH, 406UL, and 406VL, $I_{P\_IND}$ is the current being generated by the parasitic inductance 420, $R_{VDC}$ is an effective output impedance of the VDC power supply, and $R_{CS}$ is a resistance of the CS resistor 416V.

Because the current $I_{P\_IND}$ being generated by the collapse of the magnetic field of the parasitic inductor 420 decreases during the smart turn-off delay period shown in FIG. 4C, the surge voltage $V_{SURGE}$ produced in FIG. 4D is reduced compared to what it would have been if no smart turn-off delay period had occurred. This reduces the potential for the voltage surge $V_{SURGE}$ to cause damage to the devices in the circuit.

Figure 5:
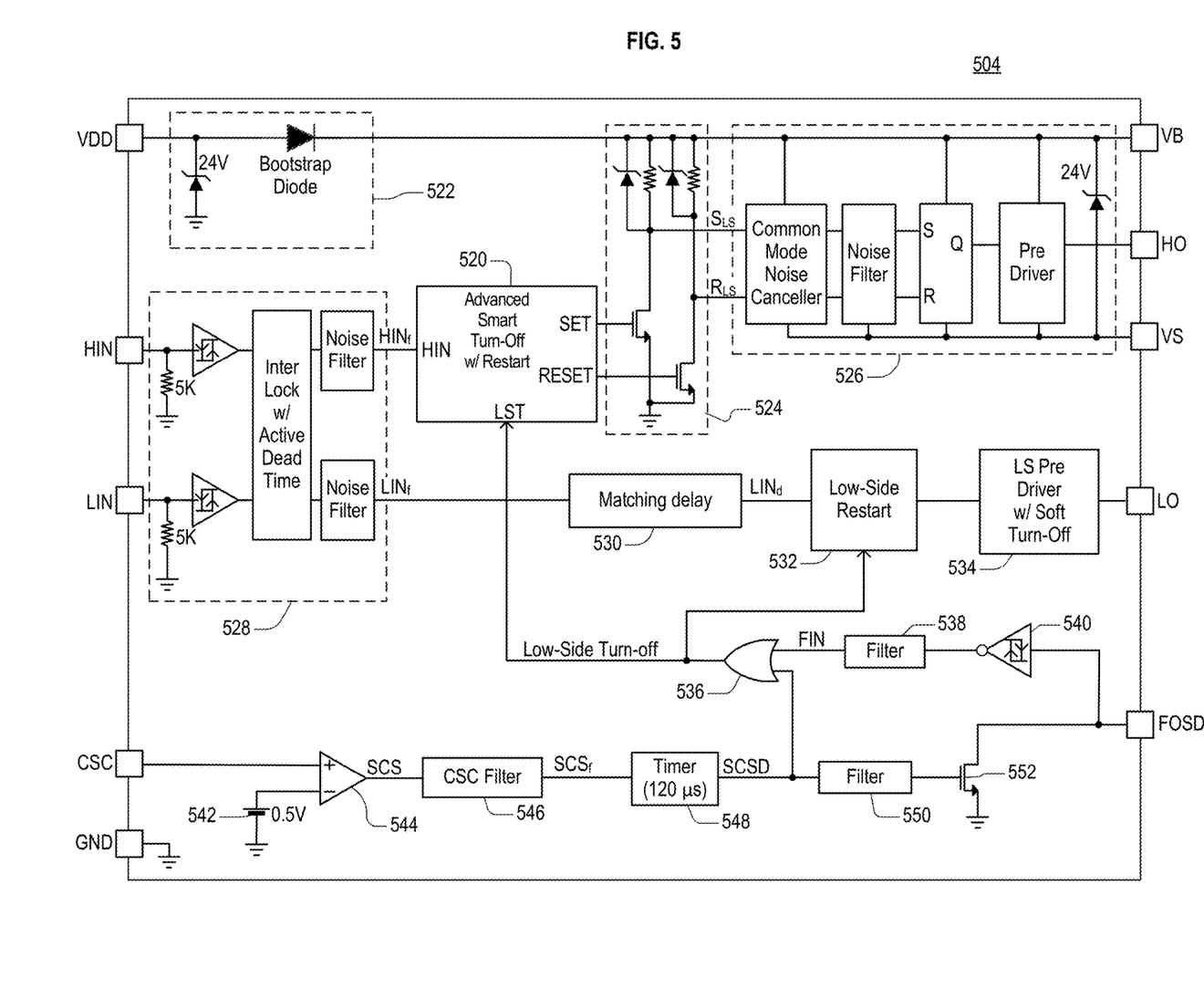
FIG. 5 illustrates a gate driver according to an embodiment.

FIG. 5 illustrates a gate driver 504 according to an embodiment, which may correspond to one or more of the first and second gate drivers 304U and 304V of FIG. 3. The gate driver 504 receives a HS control signal HIN, a LS control signal LIN, and a current sense signal CSC. The gate driver 504 further includes a logic supply voltage VDD input, a bootstrap voltage VB, a bootstrap voltage return VS, and a ground terminal GND.

The gate driver 504 further receives and generates a fault-out/shut down (FO/SD) signal FOSD that both sends and receives indications that a fault has occurred and a shutdown is to be performed. In an embodiment, the FO/SD signal FOSD is a negative-true signal configured for wired-OR operation using a pull-up resistor. In an embodiment, the pull-up resistor is external to the gate driver 504.

An LS Pre-Driver 534 generates a LS output LO having a value relative to the ground GND. The LS Pre-Driver 534 includes a soft turn-off function.

A HS drive circuit 526 generates a HS output HO according to a level-shifted set signal $S_{LS}$ and a level-shifted reset signal $R_{LS}$ received from level shifting circuit 524. The HS output HO is asserted in response to an assertion of the level-shifted set signal $S_{LS}$, and is de-asserted in response to an assertion of the level-shifted reset signal $R_{LS}$.

The level shifting circuit 524 may assert the level-shifted set signal $S_{LS}$ when a set signal SET received from a smart turn-off circuit 520 is asserted, and assert the level-shifted reset signal $R_{LS}$ when a reset signal SET from the smart turn-off circuit 520 is asserted. The level-shifted set and reset signals $S_{LS}$ and $R_{LS}$ may be active low, that is, have a low voltage value (e.g., a bootstrap voltage VB minus a breakdown voltage of a Zener diode of the level shifting circuit) when asserted and a high voltage value (e.g., the bootstrap voltage VB) when de-asserted.

The HS output HO has a value relative to a bootstrap voltage return VS. In the embodiment shown in FIG. 5, the bootstrap voltage return VS is maintained at a fixed voltage below the bootstrap voltage VB using a Zener diode as shown in the HS drive circuit 526.

The bootstrap voltage VB is generated using a bootstrap circuit 522 and external components. The external components may include a capacitor coupled between the bootstrap voltage VB and the bootstrap voltage return VS.

The HS control signal HIN and LS control signal LIN are processed by a control input filtering circuit 528 that cleans up the input signals and enforces a minimum dead time between them, thereby generating a filtered HS control signal $HIN_f$ and a filtered LS control signal $LIN_f$. The filtered HS control signal $HIN_f$ is provided to the smart turn-off circuit 520. The filtered LS control signal $LIN_f$ is provided to a matching delay circuit 530 which delays the filtered LS control signal $LIN_f$ by a predetermined matching delay to generate a delayed LS control signal $LIN_d$. The predetermined matching delay is chosen so that a propagation delay from the HS control signal HIN to the HS output HO is substantially the same as a propagation delay from the LS control signal LIN to the LS output LO.

A comparator 544 asserts a short circuit sense signal SCS when a value of the current sense signal CSC is greater than the value of a reference voltage 542. In an embodiment, the reference voltage is 0.5 volts. The output of the comparator 546 is then filtered by a CSC filter 546 to produce a filtered short circuit signal $SCS_f$. The filtered short circuit signal $SCS_f$ is provided to a Timer 548 which asserts, for a predetermined fault duration time, a short circuit detect signal SCSD in response to the filtered short circuit signal $SCS_f$ being asserted, and de-asserts the short circuit shut down signal SCSD after the predetermined fault duration time has elapsed. In an embodiment, the predetermined fault duration time is 120 microseconds.

The short circuit shut down signal SCSD is coupled through a noise filter 550 to a switch 552. In an embodiment, the switch 552 is a MOSFET, such as the n-channel MOSFET shown in FIG. 5. In response to the short circuit shut down signal SCSD being asserted, the switch 552 pulls the FO/SD signal FOSD down to ground.

An inverting Schmitt trigger 540 receives the FO/SD signal FOSD and asserts, through a noise filter 538, a fault input signal FIN in response to the FO/SD signal FOSD being pulled down. The FO/SD signal FOSD may be pulled down by the switch 522 or by an external circuit or device, such as another gate driver, coupled to the FO/SD signal FOSD.

An OR gate 536 asserts a Low-Side Turn-off signal LST when either or both of the short circuit shut down signal SCSD and the fault input signal FIN are asserted, and de-asserts the Low-Side Turn-off signal LST when both the short circuit shut down signal SCSD and the fault input signal FIN are de-asserted.

The LS Restart circuit 532 receives the delayed LS control signal $LIN_d$ and the LS turn-off signal LST and controls the LS Pre-Driver 534. When the LS turn-off signal LST is de-asserted, the LS Restart circuit 532 controls the LS Pre-Driver 534 to turn on a switch coupled to the LS output LO when the delayed LS control signal $LIN_d$ is asserted, and controls the LS Pre-Driver 534 to turn off the switch when the delayed LS control signal $LIN_d$ is de-asserted. In response to the LS turn-off signal LST being asserted, the LS Restart circuit 532 controls the LS Pre-Driver 534 to perform a soft turn-off of the switch and to provide a restart function that is an activation of out signal by next control signals after fault clear.

The smart turn-off circuit 520 receives the filtered HS control signal $HIN_f$ and the LS turn-off signal LST and generates the set signal SET and the reset signal RESET according to the received signals, as described with respect to FIGS. 6 through 10, below.

Figure 6:
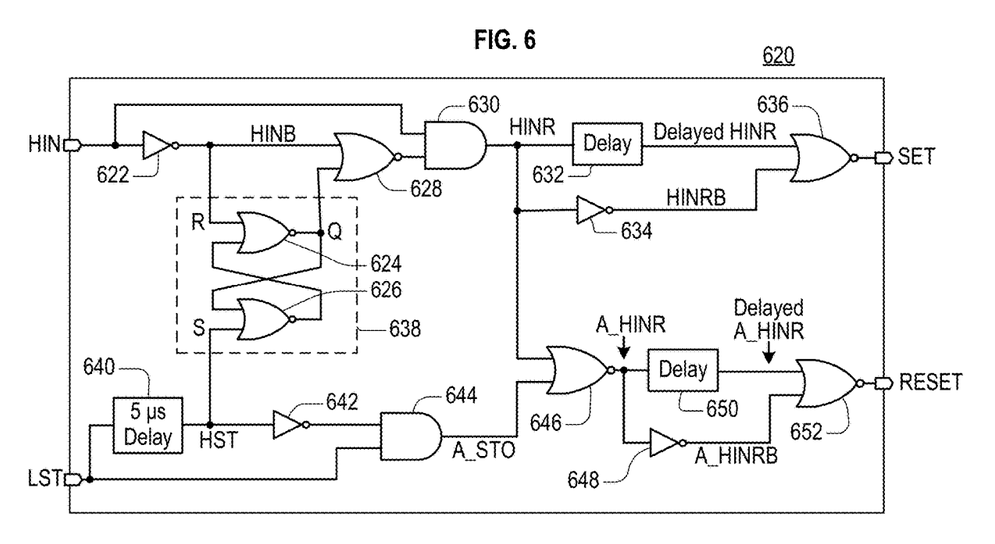
FIG. 6 illustrates a smart turn-off circuit according to an embodiment.

FIG. 6 illustrates a smart turn-off circuit 620 according to an embodiment. The smart turn-off circuit 620 receives a HS control signal HIN and a LS turn-off signal LST, and produces a set signal SET and a reset signal RESET using the received signals.

The smart turn-off circuit 620 includes first, second, third, and fourth inverters 622, 634, 642, and 648, first, second, third, fourth, fifth, and sixth NOR gates 624, 626, 628, 636, 646, and 652, first and second AND gates 630 and 644, and first, second, and third delay circuits 640, 632, and 650.

The first delay circuit 640 produces a HS Turn-off signal HST by delaying the LS Turn-off signal LST by a predetermined Advanced Smart Turn-Off (ASTO) delay time. In an embodiment, the predetermined ASTO delay time is 5 microseconds, but embodiments are not limited thereto. In an embodiment, the first delay circuit 640 only applies the ASTO delay time to rising edges (that is, assertions) of the LS turn-off signal LST, and responds to falling edges (that is, de-assertions) of the LS turn-off signal LST by de-asserting the HS turn-off signal HST without delay.

The second AND gate 644 receives an inverted version of the HS Turn-Off signal HST from the third inverter 642 and also receives the LS Turn-off signal LST. The second AND gate 644 generates an Advanced Smart Turn-Off (ASTO) signal A_STO that is asserted for the duration of the pre-determined smart turn-off duration in response to the assertion of the LS Turn-off signal LST. The assertion of the ASTO signal A_STO indicates that the smart turn-off circuit 620 is preparing to perform a smart turn-off.

The first and second NOR gates 624 and 626 are coupled together to form a Set-Reset Flip-Flop (SRFF) 638. The SRFF 638 includes a reset input R that receives an inverted HS control signal HINB from the first inverter 622 and a set input S that receives the HS Turn-Off signal HST from the first delay circuit 640. The SRFF 638 produces an output Q according to the values of its S and R inputs.

The third NOR gate 628 and the first AND gate 630 combine the HS control signal HIN, the inverted HS control signal HINB, and the output Q of the SRFF 638 to produce the HS restart signal HINR according to the equation HINR=HIN and NOT(HINB or Q).

The second delay circuit 632, the second inverter 634, and the fourth NOR gate 636 receive the HS restart signal HINR and produce a set signal SET. A positive-going set pulse is generated on the set signal SET in response to the assertion of the HS restart signal HINR. The positive-going set pulse has a duration corresponding to a predetermined delay of the second delay circuit 632. In an embodiment, the predetermined delay of the second delay circuit 632 is 200 nanoseconds, but embodiments are not limited thereto.

The fifth NOR gate 646 receives the ASTO signal A_STO and the HS restart signal HINR and generates an ASTO reset input signal A_HINR. The ASTO reset input signal A_HINR is asserted when both the ASTO signal A_STO and the HS restart signal HINR are de-asserted.

The third delay circuit 650, the fourth inverter 648, and the sixth NOR gate 652 receive the ASTO reset input signal A_HINR and produce a reset signal RESET. A positive-going reset pulse is generated on the reset signal RESET in response to the assertion of the ASTO reset input signal A_HINR. The positive-going reset pulse has a duration corresponding to a predetermined delay of the third delay circuit 650. In an embodiment, the predetermined delay of the second delay circuit 650 is 200 nanoseconds, but embodiments are not limited thereto.

Accordingly, the smart turn-off circuit 620 generates a positive-going reset pulse on the reset signal RESET in response to: the HS restart signal HINR being de-asserted while the ASTO signal A_STO is de-asserted; in response to the ASTO signal A_STO being de-asserted while the HS restart signal HINR is de-asserted; and in response to both the HS restart signal HINR and the ASTO signal A_STO being de-asserted simultaneously. Pulses are not generated on the reset signal RESET when one or both of the HS restart signal HINR and the ASTO signal A_STO are asserted.

Figure 7:
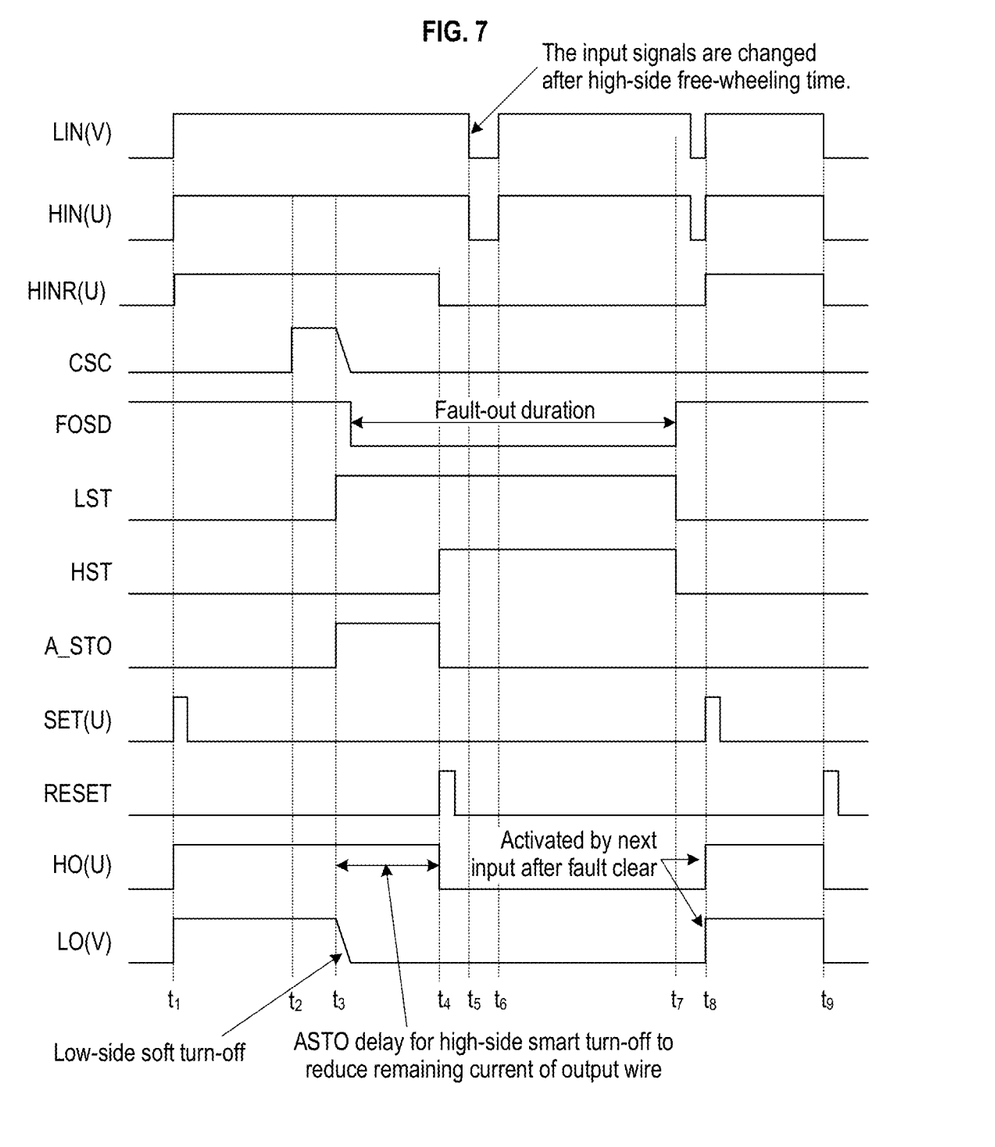
FIG. 7 includes waveforms illustrating operations of a gate driver including a smart turn-off circuit according to an embodiment.

FIG. 7 includes waveforms illustrating operations of a gate driver including a smart turn-off circuit according to an embodiment. The gate driver may be the gate driver 504 of FIG. 5, and the smart turn-off circuit may be the Advanced Smart Turn-Off (ASTO) circuit 620 of FIG. 6.

The waveforms shown include a V-phase LS control signal LIN(V), a U-phase HS control signal HIN(U), a HS restart signal HINR, a Current Sense signal CSC, a Fault Out/Shut Down signal FOSD, a LS turn-off signal LST, a HS turn-off signal HST, an ASTO signal A_STO, a set signal SET, a reset signal RESET, a HS out signal HO, and a LS out signal LO. The signals shown correspond to the like-named signals in FIGS. 5 and 6. Unless otherwise indicated, the signals correspond to those in a U-phase gate driver.

At a first time $t_1$, the V-phase LS control signal LIN(V) and U-phase HS control signal HIN(U) are asserted. In response, the V-phase LS out signal LO(V) and the HS restart signal HINR(U), respectively, are asserted. In response to the HS restart signal HINR(U) being asserted, a set pulse is generated on the set signal SET(U). In response to the set pulse on the set signal SET(U), the U-phase HS out signal HO(U) is asserted.

At a second time $t_2$, an overcurrent condition (such as a short circuit) causes the value of the current sense signal CSC to rise.

At a third time $t_3$, the rise in the value of the current sense signal CSC is detected as a short-circuit condition, causing the LS turn-off signal LST to be asserted for a pre-determined duration. In an embodiment, the predetermined duration corresponds to a duration of the Timer 548 of FIG. 5.

In response to the assertion of the LS turn-off signal LST, the ASTO signal A_STO is asserted and a soft turn-off of a LS switch of phase V is performed using the V-phase LS out signal LO(V). A filtering and propagation delay after the LS turn-off signal LST is asserted, the Fault Out/Shut Down signal FOSD is pulled low to indicate to other gate drivers that an overcurrent situation is occurring.

At a fourth time $t_4$, in response to a predetermined ASTO delay time passing after the assertion of the LS turn-off signal LST, the HS turn-off signal HST is asserted. The predetermined ASTO delay time may correspond to the delay time of the first delay circuit 640 of FIG. 6. The ASTO delay time $T_{ASTOD}$ may be selected to provide a guaranteed minimum freewheeling time for energy stored in a parasitic inductance to dissipate, in order to reduce a surge voltage produced by the energy stored in a parasitic inductance when a HS switch is turned off. In an embodiment, the ASTO delay time may be 5 microseconds, but embodiments are not limited thereto. In an embodiment, the ASTO delay time is only applied to rising edges of the LS turn-off signal LST, and falling edges of the LS turn-off signal LST cause the HS turn-off signal HST to be de-asserted without delay.

In response to the HS turn-off signal HST being asserted, the ASTO signal A_STO and the HS restart signal HINR(U) are de-asserted. In response to the ASTO signal A_STO being de-asserted when the HS restart signal HINR(U) is de-asserted, a positive-going reset pulse is generated on the reset signal RESET. In response to the positive-going reset pulse on the reset signal RESET, the U-phase HS out signal HO(U) is de-asserted.

At a fifth time $t_5$, the V-phase LS control signal LIN(V) and U-phase HS control signal HIN(U) are de-asserted. However, because the LS turn-off signal LST and the HS turn-off signal HST are asserted at the fifth time $t_5$, the de-assertions of the V-phase LS control signal LIN(V) and U-phase HS control signal HIN(U) at the fifth time $t_5$ have no effect.

At a sixth time $t_6$, the V-phase LS control signal LIN(V) and U-phase HS control signal HIN(U) are asserted. However, because the LS turn-off signal LST and the HS turn-off signal HST are asserted at the sixth time $t_6$, the assertions of the V-phase LS control signal LIN(V) and U-phase HS control signal HIN(U) at the sixth time $t_6$ have no effect.

At a seventh time $t_7$, the assertion of the LS turn-off signal LST ends. The de-assertion of the LS turn-off signal LST causes the HS turn-off signal HST to be de-asserted and releases the pull-down of the FO/SD signal FOSD, allowing the FO/SD signal FOSD to be pulled up.

At an eight time $t_8$, the V-phase LS control signal LIN(V) and U-phase HS control signal HIN(U) are asserted. In response, the V-phase LS out signal LO(V) and the HS restart signal HINR(U) are asserted. In response to the HS restart signal HINR(U) being asserted, a set pulse is generated on the set signal SET(U). In response to the set pulse on the set signal SET(U), the U-phase HS out signal HO(U) is asserted.

At an ninth time $t_9$, the V-phase LS control signal LIN(V) and U-phase HS control signal HIN(U) are de-asserted. In response, the V-phase LS out signal LO(V) and the HS restart signal HINR(U), respectively, are de-asserted. In response to the HS restart signal HINR(U) being de-asserted when the ASTO signal A_STO is de-asserted, a reset pulse is generated on the reset signal RESET. In response to the reset pulse on the reset signal RESET, the U-phase HS out signal HO(U) is de-asserted.

Figure 8:
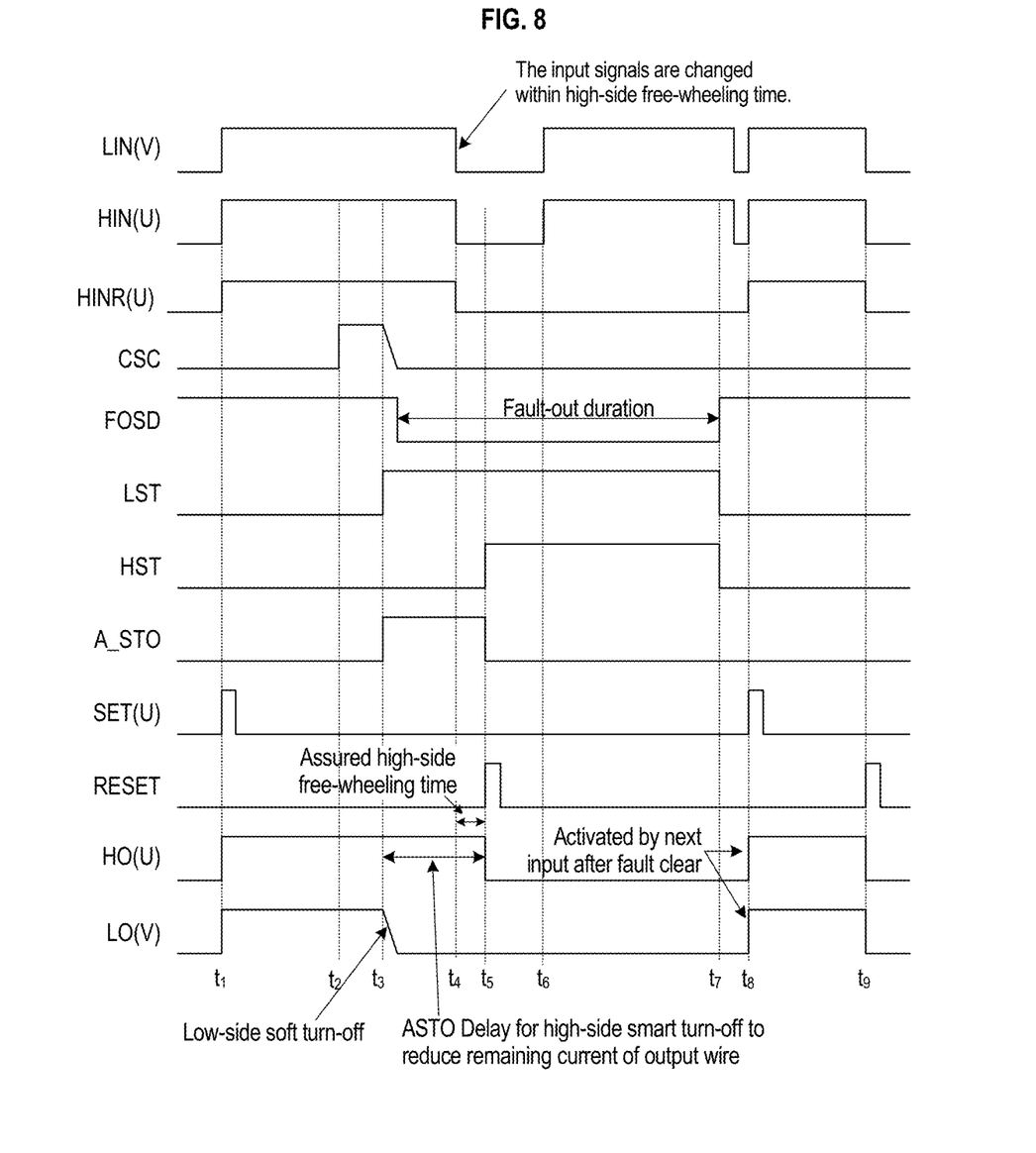
FIG. 8 includes waveforms illustrating further operations of a gate driver including a smart turn-off circuit according to an embodiment.

FIG. 8 includes waveforms illustrating further operations of a gate driver including a smart turn-off circuit according to an embodiment. The signals are the same as those illustrated in FIG. 7.

Operation of the gate driver and smart turn-off circuit at first, second, and third times $t_1$, $t_2$, and $t_3$ of FIG. 8 are as respectively described for those times in FIG. 7.

At a fourth time $t_4$, the V-phase LS control signal LIN(V) and U-phase HS control signal HIN(U) are de-asserted, before the end of the ASTO delay time. In response to the de-assertion of the U-phase HS control signal HIN(U), the HS restart signal HINR(U) is de-asserted. However, because the ASTO signal A_STO is asserted and the LS soft turn-off has already been performed at the fourth time $t_4$, the de-assertions of the V-phase LS control signal LIN(V) and U-phase HS control signal HIN(U) at the fourth time $t_4$ have no effect.

At a fifth time $t_5$, in response to a predetermined ASTO delay time passing after the assertion of the LS turn-off signal LST, the HS turn-off signal HST is asserted. The predetermined ASTO delay time may correspond to the delay time of the first delay circuit 640 of FIG. 6. The ASTO delay time $T_{ASTOD}$ may be selected to provide a guaranteed minimum freewheeling time for energy stored in a parasitic inductance to dissipate, in order to reduce a surge voltage produced by the energy stored in a parasitic inductance when a HS switch is turned off. In an embodiment, the ASTO delay time may be 5 microseconds, but embodiments are not limited thereto. In an embodiment, the ASTO delay time is only applied to rising edges of the LS turn-off signal LST, and falling edges of the LS turn-off signal LST cause the HS turn-off signal HST to be de-asserted without delay.

In response to the HS turn-off signal HST being asserted, the ASTO signal A_STO is de-asserted. In response to the ASTO signal A_STO being de-asserted when the HS restart signal HINR(U) is de-asserted, a positive-going reset pulse is generated on the reset signal RESET. In response to the positive-going reset pulse on the reset signal RESET, the U-phase HS out signal HO(U) is de-asserted.

Operation of the gate driver and smart turn-off circuit at sixth, seventh, eighth, and ninth times $t_6$, $t_7$, $t_8$, and $t_9$ of FIG. 8 are as respectively described for those times in FIG. 7.

Figure 9:
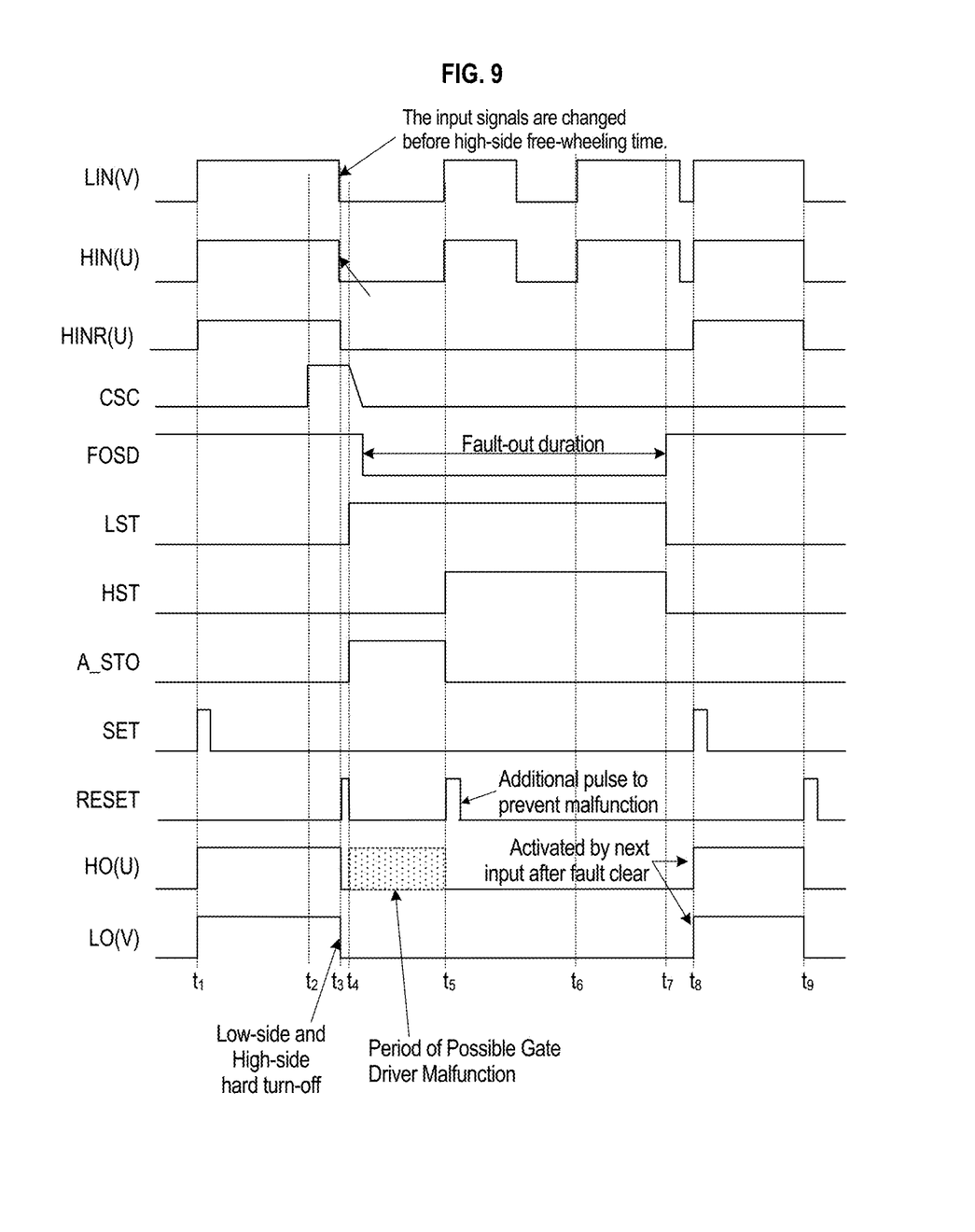
FIG. 9 includes waveforms illustrating further operations of a gate driver including a smart turn-off circuit according to an embodiment.

FIG. 9 includes waveforms illustrating further operations of a gate driver including a smart turn-off circuit according to an embodiment. The signals are the same as those illustrated in FIG. 7. The operation of the gate driver will be explained with reference to FIGS. 4A through 4D, wherein the V-phase LS control signal LIN(V) corresponds to the signal provided to the gate of the first LS switch 406UL, and the U-phase HS control signal HIN(U) corresponds to the signal provided to the gate of the second HS switch 406VH.

At a first time $t_1$, the V-phase LS control signal LIN(V) and U-phase HS control signal HIN(U) are asserted. In response, the V-phase LS out signal LO(V) and the HS restart signal HINR(U), respectively, are asserted. In response to the HS restart signal HINR(U) being asserted, a set pulse is generated on the set signal SET(U). In response to the set pulse on the set signal SET(U), the U-phase HS out signal HO(U) is asserted.

At a second time $t_2$, an overcurrent condition, for example, the short-circuit 418 shown in FIG. 4A, causes the value of the current sense signal CSC to rise. The overcurrent condition causes energy to be stored in the parasitic inductance 420 of FIG. 4A.

At a third time $t_3$, V-phase LS control signal LIN(V) and U-phase HS control signal HIN(U) are de-asserted before the assertion of the LS turn-off signal LST. In response to the de-assertion of the V-phase LS control signal LIN(V) and U-phase HS control signal HIN(U), the V-phase LS out signal LO(V) and U-phase HS out signal HO(U) are respectively de-asserted.

Because the V-phase LS control signal LIN(V) and U-phase HS control signal HIN(U) are respectively de-asserted at the third time $t_3$, the first LS switch 406UL and the second HS switch 406VH perform a hard turn-off, leading to the situation shown in FIG. 4D. Because the first LS switch 406UL and the second HS switch 406VH perform a hard turn-off after energy has been stored in the parasitic inductance 420 by the overcurrent condition, the energy stored in a parasitic inductance 420 is substantially larger than for a normal hard turn-off. Because a smart turn-off of the second HS switch 406VH was not performed, the hard turn-off of the second HS switch 406VH may causes a substantially higher surge voltage $V_{SURGE}$ to be generated than was the case in the scenarios illustrated in FIGS. 7 and 8.

The surge voltage $V_{SURGE}$ may cause the gate driver to malfunction and assert the U-phase HS out signal HO(U), as indicated by the shaded rectangle in the period following the fourth time $t_4$. The erroneous assertion of the U-phase HS out signal HO(U) may turn on the second HS switch 406VH.

At the fourth time $t_4$, the rise in the value of the current sense signal CSC is detected as a short-circuit condition, causing the LS turn-off signal LST to be asserted for a pre-determined duration. In an embodiment, the predetermined duration corresponds to a duration of the Timer 548 of FIG. 5.

In response to the assertion of the LS turn-off signal LST, the ASTO signal A_STO is asserted. A filtering and propagation delay after the LS turn-off signal LST is asserted, the Fault Out/Shut Down signal FOSD is pulled low to indicate to other gate drivers that an overcurrent situation is occurring.

Unlike the scenarios illustrated in FIGS. 7 and 8, because the first LS switch 406UL has already been turned off at the fourth time $t_4$, a soft turn-off of the first LS switch 406UL is not performed in response to the assertion of the LS turn-off signal LST. Furthermore, because the HS restart signal HINR(U) was already de-asserted at the fourth time $t_4$, in response to the ASTO signal A_STO being de-asserted when the HS restart signal HINR(U) is de-asserted, a positive-going reset pulse is generated on the reset signal RESET. In response to the positive-going reset pulse on the reset signal RESET, the U-phase HS out signal HO(U) is de-asserted.

At a fifth time $t_5$, in response to a predetermined ASTO delay time passing after the assertion of the LS turn-off signal LST, the HS turn-off signal HST is asserted. The predetermined ASTO delay time may correspond to the delay time of the first delay circuit 640 of FIG. 6. In an embodiment, the ASTO delay time may be 5 microseconds, but embodiments are not limited thereto.

In response to the HS turn-off signal HST being asserted, the ASTO signal A_STO is de-asserted. In response to the ASTO signal A_STO being de-asserted when the HS restart signal HINR(U) is de-asserted, a positive-going reset pulse is generated on the reset signal RESET. When the U-phase HS out signal HO(U) had been asserted due to a gate driver malfunction caused by the surge voltage $V_{SURGE}$, the U-phase HS out signal HO(U) is de-asserted in response to the positive-going reset pulse on the reset signal RESET.

At a sixth time $t_6$, the V-phase LS control signal LIN(V) and U-phase HS control signal HIN(U) are asserted. However, because the LS turn-off signal LST and the HS turn-off signal HST are asserted at the sixth time $t_6$, the assertions of the V-phase LS control signal LIN(V) and U-phase HS control signal HIN(U) at the sixth time $t_6$ have no effect.

At a seventh time $t_7$, the assertion of the LS turn-off signal LST ends. The de-assertion of the LS turn-off signal LST causes the HS turn-off signal HST to be de-asserted and releases the pull-down of the FO/SD signal FOSD, allowing the FO/SD signal FOSD to be pulled up.

In the absence of the positive-going reset pulse on the reset signal RESET generated by the embodiment at the fifth time $t_5$, the second HS switch 406VH might still be turned on at the seventh time $t_7$ a result of the gate malfunction that might have occurred after the fourth time $t_4$. Because other phases of the circuit can be activated after the seventh time $t_7$, the second LS switch 406VL of FIG. 4 could be turned on, and if the second HS switch 406VH has not been turned off by the positive-going reset pulse on the reset signal RESET generated by the embodiment at the fifth time $t_5$, a potentially destructive current could flow through the second HS switch 406VH and the second LS switch 406VL. This is prevented by the embodiment.

Operation of the gate driver and smart turn-off circuit at eighth and ninth times $t_8$ and $t_9$ of FIG. 9 are as respectively described for those times in FIG. 7.

Figure 10:
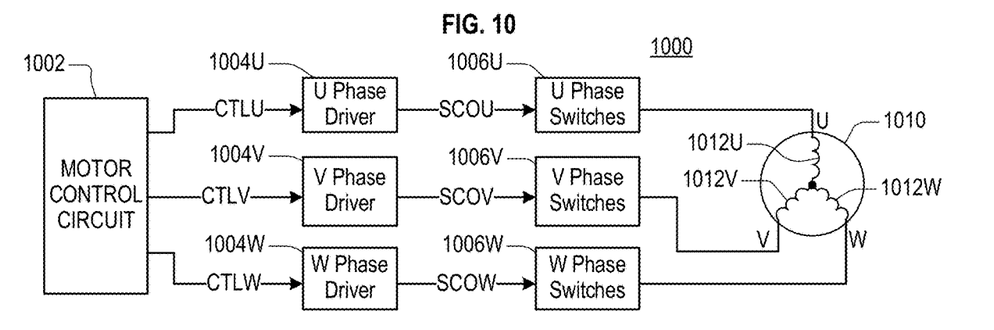
FIG. 10 illustrates a 3-phase motor control apparatus according to an embodiment.

FIG. 10 illustrates a three-phase motor control apparatus 1000 according to an embodiment, that controls an electric motor 1010 which includes first, second, and third coils 1012U, 1012V, and 1012W. The apparatus 1000 controls magnitudes and directions of currents through the coils 1012U, 1012V, and 1012W.

The apparatus 1000 includes a motor control circuit 1002, first, second, and third gate drivers 1004U, 1004V, and 1004W, and first second, and third switch circuits 1006U, 1006V, and 1006W. The gate drivers 1004U, 1004V, and 1004W may together correspond to the gate drivers 104 of FIG. 1, and the switch circuits 1006U, 1006V, and 1006W may together correspond to the switch circuits 106 of FIG. 1.

In an embodiment, the gate drivers 1004U, 1004V, and 1004W are included in a same integrated circuit device. In an embodiment, the gate drivers 1004U, 1004V, and 1004W and the switch circuits 1006U, 1006V, and 1006W are included in a same integrated circuit device.

The apparatus 1000 operates similarly to the apparatus 200 of FIG. 2, described above, and a detailed description is therefore omitted for brevity.

In response to the detection of the fault condition when the current is flowing in through a selected pair of switch circuits of the switch circuits 1006U, 1006V, and 1006W, the apparatus 1000 may control a LS switch of a first of the pair of switch circuits to perform a soft turn-off while maintaining a HS switch of the second of the pair of switch circuits in the on state. After the soft turn-off of the LS switch is complete and after a freewheeling interval has elapsed from the detection of the fault condition, the apparatus 1000 may turn off the HS switch. In an embodiment, the apparatus 1000 controls the HS switch to perform a hard turn-off.

The apparatus 1000 prevents the HS switch from being turned off by the second driver control signals CTLV during the freewheeling interval. Furthermore, the apparatus 1000 may operate to ensure that all HS switches are turned off at the end of the freewheeling interval when a malfunction causes a HS switch of the switch circuits 1006U, 1006V, and 1006W to be turned on after the fault condition arises.

Figure 11:
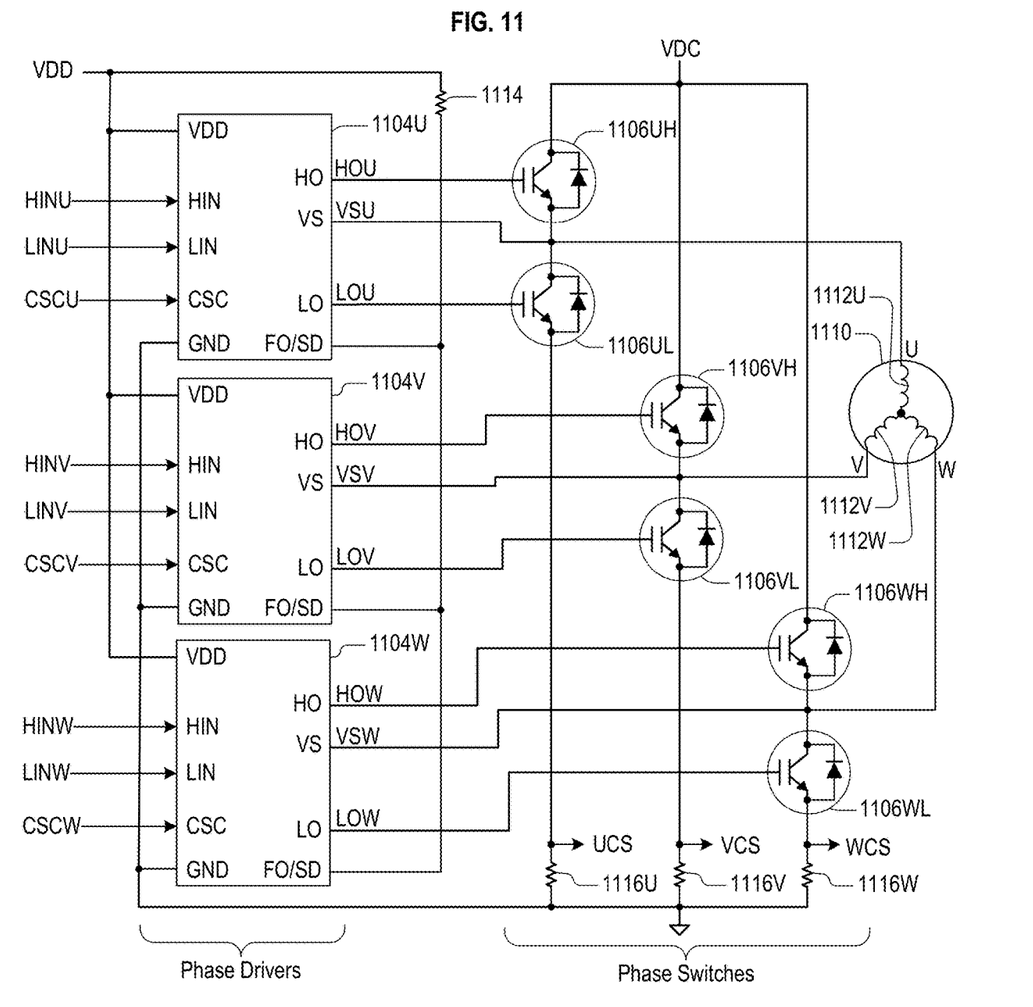
FIG. 11 illustrates a portion of a 3-phase motor control circuit according to an embodiment.

FIG. 11 illustrates a circuit corresponding to a portion of the apparatus 1000 of FIG. 10 according to an embodiment. The illustrated portions correspond to the gate drivers 1004U, 1004V, and 1004W and switch circuits 1006U, 1006V, and 1006W of FIG. 10. Coils 1112U, 1112V, and 1112W of the electric motor 1110 of FIG. 11 corresponds to the coils 1012U, 1012V, and 1012W of the electric motor 1010 of FIG. 10.

The circuit of FIG. 11 includes first, second, and third gate drivers 1104U, 1104V, and 1104W, first, second, and third HS switches 1106UH, 1106VH, and 1106WH, first, second, and third LS switches 1106UL, 1106VL, and 1106WL, a pull-up resistor 1114, and first, second, and third current sense (CS) resistors 1116U, 1116V, and 1116W. The first HS switch 1106UH, first LS switch 1106UL, and first CS resistor 1116U together correspond to the first switch circuit 1106U of FIG. 11. The second HS switch 1106VH, second LS switch 1106VL, and second CS resistor 1116V together correspond to the second switch circuit 1106V of FIG. 11. The third HS switch 1106WH, third LS switch 1106WL, and third CS resistor 1116W together correspond to the third switch circuit 1106W of FIG. 11.

The circuit of FIG. 11 operates similarly to the circuit of FIG. 3 as described above, and accordingly further description of the circuit of FIG. 11 will be omitted for brevity.

Figure 12:
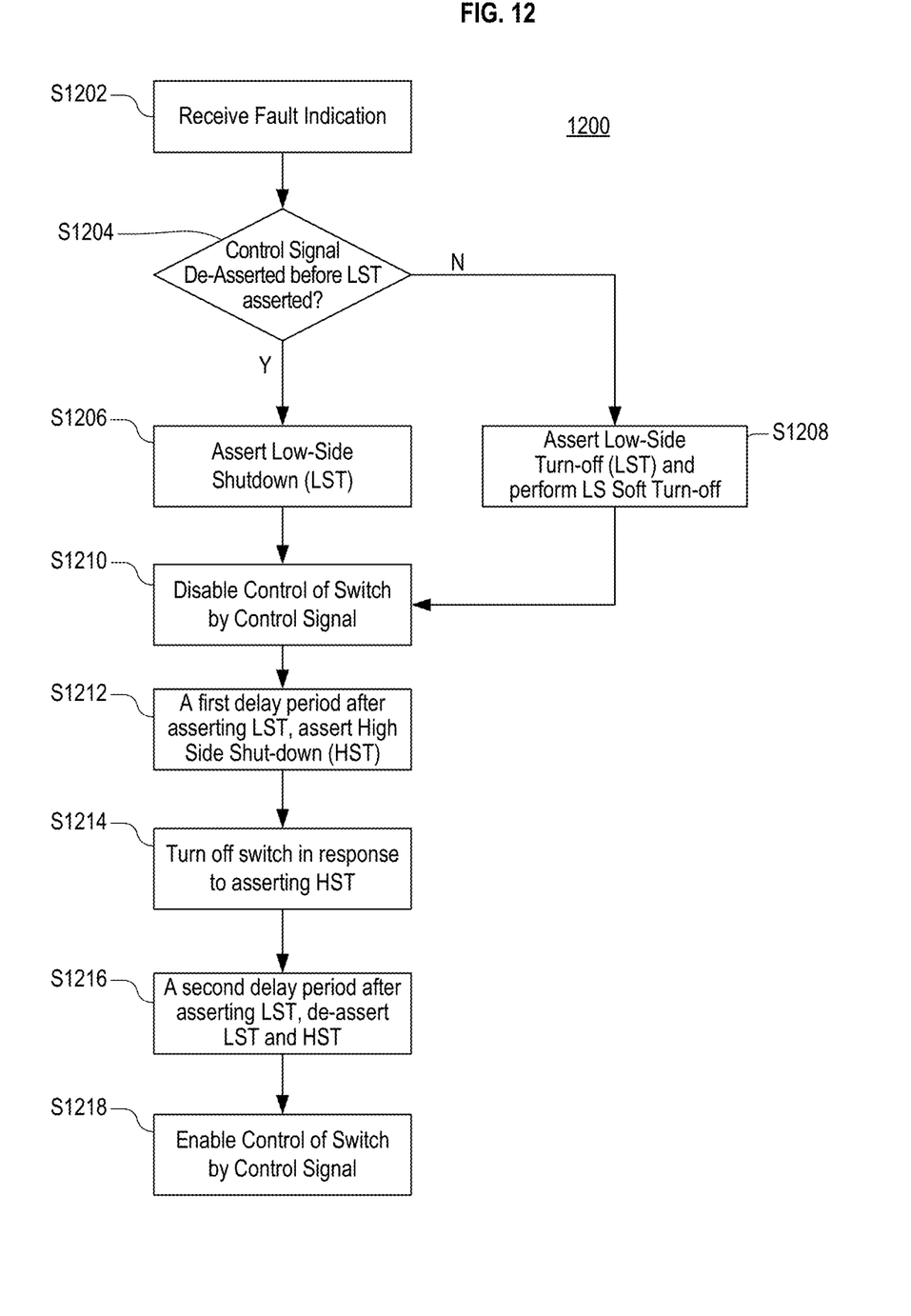
FIG. 12 illustrates a smart turn-off process according to an embodiment.

FIG. 12 illustrates a smart turn-off process 1200 performed by a circuit according to an embodiment. In an embodiment, the process 1200 may be performed using an advanced smart turn-off circuit in a gate driver circuit, such as the advanced smart turn-off circuit 520 in the gate driver 504 of FIG. 5.

At S1202, the circuit receives a fault indication. In an embodiment, the fault indication indicates an overcurrent situation, such as may be caused by a short circuit between terminals of an electric motor controlled using the circuit. In an embodiment, the fault indication may be either or both of an indication determined using a current sense signal or a fault output/shut-down indication generated by another gate driver circuit. In an embodiment, the circuit asserts the fault output/shut-down indication in response to the fault indication.

At S1204, the process 1200 determines whether a control signal has been de-asserted. In an embodiment, the control signal corresponds to a control signal for controlling a switch coupled to the circuit, wherein assertion of the control signal indicates the switch is to be turned on, and de-assertion of the control signal indicates the switch is to be turned off. In an embodiment, the switch is a High-Side (HS) switch of a pair of switches controlled using the circuit, the other switch of the pair being a Low Side (LS) switch. The HS switch may be configured to source current, and the LS switch to sink current.

When the process 1200 determines that the control signal is de-asserted, the process 1200 proceeds to S1206. When the process 1200 determines that the control signal is asserted, the process 1200 proceeds to S1208.

At S1206, the process 1200 asserts a Low-Side Turn-off (LST) signal in response to the fault indication, and proceeds to S1210.

At S1208, the process 1200 asserts the LST signal in response to the fault indication and proceeds to S1210. In an embodiment, the process 1200 also initiates a soft turn-off of the LS switch in response to the assertion of the LST signal.

As S1210, the process 1200 disables control of the HS switch by the control signal, preventing the control signal from affecting whether the HS switch is on or off. In an embodiment, the process 1200 disables the control of the HS switch by the control signal by preventing the assertion of either or both of a Set and a Reset signal in response to a value of the control signal, wherein the Set signal causes the HS switch to be turned on, and the Reset signal causes the HS switch to be turned off.

As S1212, a first delay period after the assertion of the LST signal, the process 1200 asserts a High Side Turn-off (HST) signal. The first delay period may correspond to a predetermined minimum freewheeling duration. In an embodiment, the first delay period is 5 microseconds.

At S1214, the process 1200 turns off the HS switch (if it is on) in response to the assertion of the HST signal. In an embodiment, the process 1200 asserts the Reset signal in response to the assertion of the HST signal, and the Reset signal is coupled to a reset input of a latch used to generate a gate control signal of the HS switch.

At S1216, a second delay period after the assertion of the LST signal, the process 1200 de-asserts the LST and HST signals. In an embodiment, the second delay period is 120 microseconds. In an embodiment, the process 1200 also de-asserts the fault output/shut-down indication a second delay period after the assertion of the LST signal.

At S1218, in response to the de-assertion of the LST and HST signals, the process 1200 enables control of the HS switch by the control signal, allowing the control signal to affect whether the HS switch is on or off. In an embodiment, the process 1200 enables the control of the HS switch by the control signal by allowing the assertion of either or both of the Set and the Reset signal in response to the value of the control signal.

Embodiments of the present disclosure include electronic devices, e.g., one or more packaged semiconductor devices, configured to perform one or more of the operations described herein. However, embodiments are not limited thereto.

While this invention has been described in connection with what is presently considered to be practical embodiments, embodiments are not limited to the disclosed embodiments, but, on the contrary, may include various modifications and equivalent arrangements included within the spirit and scope of the appended claims. The order of operations described in a process is illustrative and some operations may be re-ordered. Further, two or more embodiments may be combined.

What is claimed is:

1. A circuit comprising:
a delay circuit having an input coupled to a first turn-off signal and an output producing a second turn-off signal, the delay circuit producing the second turn-off signal by delaying an assertion of the first turn-off signal by a freewheeling duration;
a first logic circuit having first and second inputs respectively coupled to the first and second turn-off signals and an output producing an advanced smart turn-off signal, the first logic circuit asserting the advanced smart turn-off signal when the first turn-off signal is asserted and the second turn-off signal is not asserted; and
a second logic circuit having a first input coupled to a restart signal, a second input coupled to the advanced smart turn-off signal and an output producing an advanced smart reset signal, the second logic circuit asserting the advanced smart reset signal when the restart signal and the advanced smart turn-off signal are de-asserted, and de-asserting the advanced smart reset signal when the restart signal, the advanced smart turn-off signal, or both are asserted.

2. The circuit of claim 1, further comprising:
a first pulse generator circuit having an input coupled to the restart signal and an output producing a set signal, the first pulse generator circuit outputting a pulse on the set signal in response to an assertion of the restart signal; and
a second pulse generator circuit having an input coupled to the advanced smart reset signal and an output producing a reset signal, the second pulse generator circuit outputting a pulse on the reset signal in response to an assertion of the advanced smart reset signal.

3. The circuit of claim 2, further comprising:
a first drive circuit having a first drive output, a first input coupled to the set signal, and a second input coupled to the reset signal, the first drive circuit asserting the drive output in response to an assertion of the set signal and de-asserting the drive output in response to an assertion of the reset signal.

4. The circuit of claim 3, further comprising:
a second drive circuit having a second drive output and an input coupled to the first turn-off signal, the second drive circuit performing a soft turn-off of the second drive output in response to an assertion of the first turn-off signal.

5. The circuit of claim 4, wherein the first drive output is a high side output of a gate driver circuit, and wherein the second drive output is a low side output of the gate driver circuit.

6. The circuit of claim 5, further comprising:
a high side switch having a first conduction terminal coupled to a power supply and a control terminal coupled to the high side output of the gate driver circuit; and
a low side switch having a first conduction terminal coupled to second conduction terminal of the high side switch, a second conduction terminal coupled to a ground, and a control terminal coupled to the low side output of the gate driver circuit.

7. The circuit of claim 6, wherein the high side switch and the low side switch each include a freewheeling diode and one or more of an insulated gate bipolar transistor and a metal oxide semiconductor field effect transistor.

8. The circuit of claim 1, further comprising:
a third logic circuit having a first input coupled to a control signal, a second input coupled to the second turn-off signal, and an output producing the restart signal, the third logic circuit generating the restart signal according to the control signal when the second turn-off signal is de-asserted, and de-asserting the restart signal when the second turn-off signal is asserted.

9. A circuit comprising:
a first input to receive a control signal;
a second input to receive a first turn-off signal;
a first output to produce a set signal;
a second output to produce a reset signal; and
a delay circuit,
wherein the circuit is configured to:
generate, using the delay circuit, a second turn-off signal according to the first turn-off signal and a freewheeling duration,
produce an advanced smart turn-off signal according to the first turn-off signal and the second turn-off signal;
produce a restart signal according to the control signal and the second turn-off signal,
produce a set pulse on the set signal in response to an assertion of the restart signal, and
produce a reset pulse on the reset signal in response to a de-assertion of the restart signal when the advanced smart turn-off signal is de-asserted, and
produce the reset pulse on the reset signal in response to a de-assertion of the advanced smart turn-off signal when the restart signal is de-asserted.

10. The circuit of claim 9, wherein the electronic circuit is further configured to:
assert, the freewheeling duration after an assertion of the first turn-off signal, the second turn-off signal in response to the assertion of the first turn-off signal; and
de-assert the second turn-off signal in response to a de-assertion of the first turn-off signal.

11. The circuit of claim 9, wherein the electronic circuit is further configured to:
assert the advanced smart turn-off signal when the first turn-off signal is asserted and the second turn-off signal is de-asserted, and
de-assert the advanced smart turn-off signal when the first turn-off signal is de-asserted, the second turn-off signal is asserted, or both.

12. The circuit of claim 9, wherein the electronic circuit is further configured to:
generate the restart signal according to the control signal when the second turn-off signal is de-asserted, and
de-assert the restart signal when the second turn-off signal is asserted.

13. The circuit of claim 9, further comprising:
a first switch control signal,
wherein the electronic circuit is further configured to:
assert the first switch control signal in response to the set pulse; and
de-assert the first switch control signal in response to the reset pulse.

14. The circuit of claim 13, further comprising:
a second switch control signal,
wherein the electronic circuit is further configured to perform, in response to the assertion of the first turn-off signal when the second switch control signal is asserted, a soft turn-off of the second switch control signal.

15. A method for controlling a circuit, the method comprising:
producing, using a delay circuit, a second turn-off signal according to a first turn-off signal and a freewheeling duration;
producing, using a first logic circuit, an advanced smart turn-off signal according to the first turn-off signal and the second turn-off signal;
producing, using a second logic circuit, a restart signal according to a control signal and the second turn-off signal;
producing, using a first pulse generation circuit, a set pulse on a set signal in response to an assertion of the restart signal;
producing, using a second pulse generation circuit, a reset pulse on a reset signal in response to a de-assertion of the restart signal when the advanced smart turn-off signal is de-asserted; and
producing, using the second pulse generation circuit, the reset pulse on the reset signal in response to a de-assertion of the advanced smart turn-off signal when the restart signal is de-asserted.

16. The method of claim 15, further comprising:
asserting, the freewheeling duration after an assertion of the first turn-off signal, the second turn-off signal in response to the assertion of the first turn-off signal; and
de-asserting the second turn-off signal in response to a de-assertion of the first turn-off signal.

17. The method of claim 15, further comprising:
asserting the advanced smart turn-off signal when the first turn-off signal is asserted and the second turn-off signal is de-asserted; and
de-asserting the advanced smart turn-off signal when the first turn-off signal is de-asserted, the second turn-off signal is asserted, or both.

18. The method of claim 15, further comprising:
generating the restart signal according to the control signal when the second turn-off signal is de-asserted; and
de-asserting the restart signal when the second turn-off signal is asserted.

19. The method of claim 15, further comprising:
asserting a first switch control signal in response to the set pulse; and
de-asserting the first switch control signal in response to the reset pulse.

20. The method of claim 19, further comprising:
performing, in response to the assertion of the first turn-off signal when a second switch control signal is asserted, a soft turn-off of the second switch control signal.

* * * * *